(12) United States Patent
Merz et al.

(10) Patent No.: US 8,766,859 B2
(45) Date of Patent: Jul. 1, 2014

(54) ANTENNA STRUCTURES WITH ELECTRICAL CONNECTIONS TO DEVICE HOUSING MEMBERS

(75) Inventors: Nicholas G. L. Merz, San Francisco, CA (US); Scott A. Myers, San Francisco, CA (US); Dean F. Darnell, San Jose, CA (US); Robert W. Schlub, Cupertino, CA (US); Edward Siahaan, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 514 days.

(21) Appl. No.: 13/024,303

(22) Filed: Feb. 9, 2011

(65) Prior Publication Data

US 2012/0176754 A1    Jul. 12, 2012

Related U.S. Application Data

(63) Continuation-in-part of application No. 13/018,142, filed on Jan. 31, 2011.

(60) Provisional application No. 61/431,520, filed on Jan. 11, 2011.

(51) Int. Cl.
*H01Q 1/24* (2006.01)
(52) U.S. Cl.
USPC .......................................... 343/702; 343/906
(58) Field of Classification Search
CPC ........ H01Q 1/24; H01Q 1/243; H01Q 9/0421
USPC .................. 343/702.7 MS, 846, 848, 906
See application file for complete search history.

(56) References Cited

U.S. PATENT DOCUMENTS

| 5,173,055 | A | 12/1992 | Grabbe |
| 7,168,959 | B2 | 1/2007 | Kuo et al. |
| 7,179,126 | B2 | 2/2007 | Chen |
| 7,321,335 | B2 | 1/2008 | Egorov |
| 7,339,533 | B2 * | 3/2008 | Kurashima et al. ........... 343/702 |

(Continued)

FOREIGN PATENT DOCUMENTS

| CN | 101682119 | 3/2010 |
| CN | 201533015 | 7/2010 |
| EP | 2109185 | 10/2009 |

OTHER PUBLICATIONS

Merz et al., U.S. Appl. No. 13/018,142, filed Jan. 31, 2011.

(Continued)

*Primary Examiner* — Hoanganh Le
(74) *Attorney, Agent, or Firm* — Treyz Law Group; G. Victor Treyz; Michael H. Lyons

(57) ABSTRACT

Electronic devices may be provided that contain wireless communications circuitry. The wireless communications circuitry may include antenna structures that are formed from an internal ground plane and a peripheral conductive housing member. A conductive path may be formed that connects the peripheral conductive housing member and the internal ground plane. The conductive path may include a flex circuit. The flex circuit can include a solder flow barrier to constrain flow of solder. A metal structure may be welded to the peripheral conductive housing member. A solder pad and other traces in the flex circuit may be soldered to the metal structure at one end of the conductive path. At the other end of the conductive path, the flex circuit may be attached to the ground plane using a bracket, screw, and screw boss.

16 Claims, 12 Drawing Sheets

(56) References Cited

U.S. PATENT DOCUMENTS

| | | |
|---|---|---|
| 7,672,142 B2 | 3/2010 | Wang et al. |
| 7,688,267 B2 | 3/2010 | Hill |
| 7,705,795 B2 | 4/2010 | Chiang et al. |
| 7,722,398 B2 | 5/2010 | Ma |
| 7,724,530 B2 | 5/2010 | Clayton et al. |
| 7,750,857 B2 | 7/2010 | Kim |
| 7,808,434 B2 | 10/2010 | White et al. |
| 7,876,274 B2 | 1/2011 | Hobson et al. |
| 7,889,139 B2 * | 2/2011 | Hobson et al. ................ 343/702 |
| 2004/0257283 A1 | 12/2004 | Asano et al. |
| 2008/0074329 A1 | 3/2008 | Caballero et al. |
| 2008/0316115 A1 | 12/2008 | Hill et al. |
| 2008/0316117 A1 | 12/2008 | Hill et al. |
| 2009/0065933 A1 | 3/2009 | Takehara et al. |
| 2009/0153410 A1 | 6/2009 | Chiang et al. |
| 2009/0174612 A1 | 7/2009 | Ayala et al. |
| 2009/0256759 A1 | 10/2009 | Hill et al. |
| 2009/0273523 A1 | 11/2009 | Sakuma |
| 2010/0123632 A1 * | 5/2010 | Hill et al. ...................... 343/702 |
| 2010/0321255 A1 | 12/2010 | Kough et al. |
| 2011/0316751 A1 * | 12/2011 | Jarvis et al. .................. 343/702 |

OTHER PUBLICATIONS

Merz et al., U.S. Appl. No. 13/024,300, filed Feb. 9, 2011.
Hobson et al., U.S. Appl. No. 13/008,586, filed Jan. 18, 2011.

* cited by examiner

ANTENNA STRUCTURES WITH ELECTRICAL CONNECTIONS TO DEVICE HOUSING MEMBERS

CROSS-REFERENCE TO RELATED APPLICATIONS

This application is a Continuation-In-Part application of U.S. application Ser. No. 13/018,142 filed Jan. 31, 2011, which is hereby incorporated by reference herein in its entirety, and which claims the benefit of provisional patent application No. 61/431,520, filed Jan. 11, 2011, which is hereby incorporated by reference herein in its entirety.

BACKGROUND

This relates generally to electronic devices, and, more particularly, to conductive electronic device structures such as structures associated with antennas for supporting wireless communications.

Electronic devices such as cellular telephones and other devices often contain wireless communications circuitry. The wireless communications circuitry may include, for example, cellular telephone transceiver circuits for communicating with cellular telephone networks. Wireless communications circuitry in an electronic device may also include wireless local area network circuits and other wireless circuits. Antenna structures are used in transmitting and receiving wireless signals.

To satisfy consumer demand for small form factor wireless devices, manufacturers are continually striving to implement wireless communications circuitry such as antennas using compact arrangements. At the same time, it may be desirable to include conductive structures such as metal device housing components in an electronic device. Because conductive components can affect radio-frequency performance, care must be taken when incorporating antennas into an electronic device that includes conductive structures. In some arrangements, it may be desirable to use conductive housing structures in forming antenna structures for a device. Doing so may entail formation of electrical connections between different portions of the device. For example, it may be desirable to form an electrical connection between internal device components and a conductive peripheral housing member. Electrical connection arrangements based on springs have been used to form such connections. Spring-based connections may be satisfactory in some situations, but pose challenges because they are generally not insulated from their surroundings and can be challenging to adjust during manufacturing. Springs also present the possibility of becoming loose during daily use, which could pose reliability challenges.

It would therefore be desirable to be able to provide improved arrangements for forming electrical connections with conductive structures such as conductive electronic device housing members.

SUMMARY

Electronic devices may be provided that contain wireless communications circuitry. The wireless communications circuitry may include antenna structures that are formed from conductive housing structures. For example, an electronic device may be provided that has an antenna formed from an internal ground plane and a peripheral conductive housing member.

The ground plane and the peripheral conductive housing member may be separated by a gap. The antenna may include a conductive path that connects the peripheral conductive housing member and the internal ground plane across the gap. When the gaps is small, such as on the order of 1 mm or less, in some embodiment, a non-conductive barrier can be interposed to reduce the likelihood of undesired dendrite formations.

The conductive path may include a flex circuit. A metal structure may be welded to the peripheral conductive housing member. A solder pad and other traces in the flex circuit may be soldered to the metal structure at one end of the conductive path. The flex circuit can also include a solder flow barrier to constrain flow of solder. At the other end of the conductive path the flex circuit may be attached to the ground plane using a bracket, screw, and screw boss.

Further features of the invention, its nature and various advantages will be more apparent from the accompanying drawings and the following detailed description of the preferred embodiments.

DETAILED DESCRIPTION

Electronic devices may be provided with wireless communications circuitry. The wireless communications circuitry may be used to support wireless communications in one or more wireless communications bands. Antenna structures in an electronic device may be used in transmitting and receiving radio-frequency signals.

Figure 1:
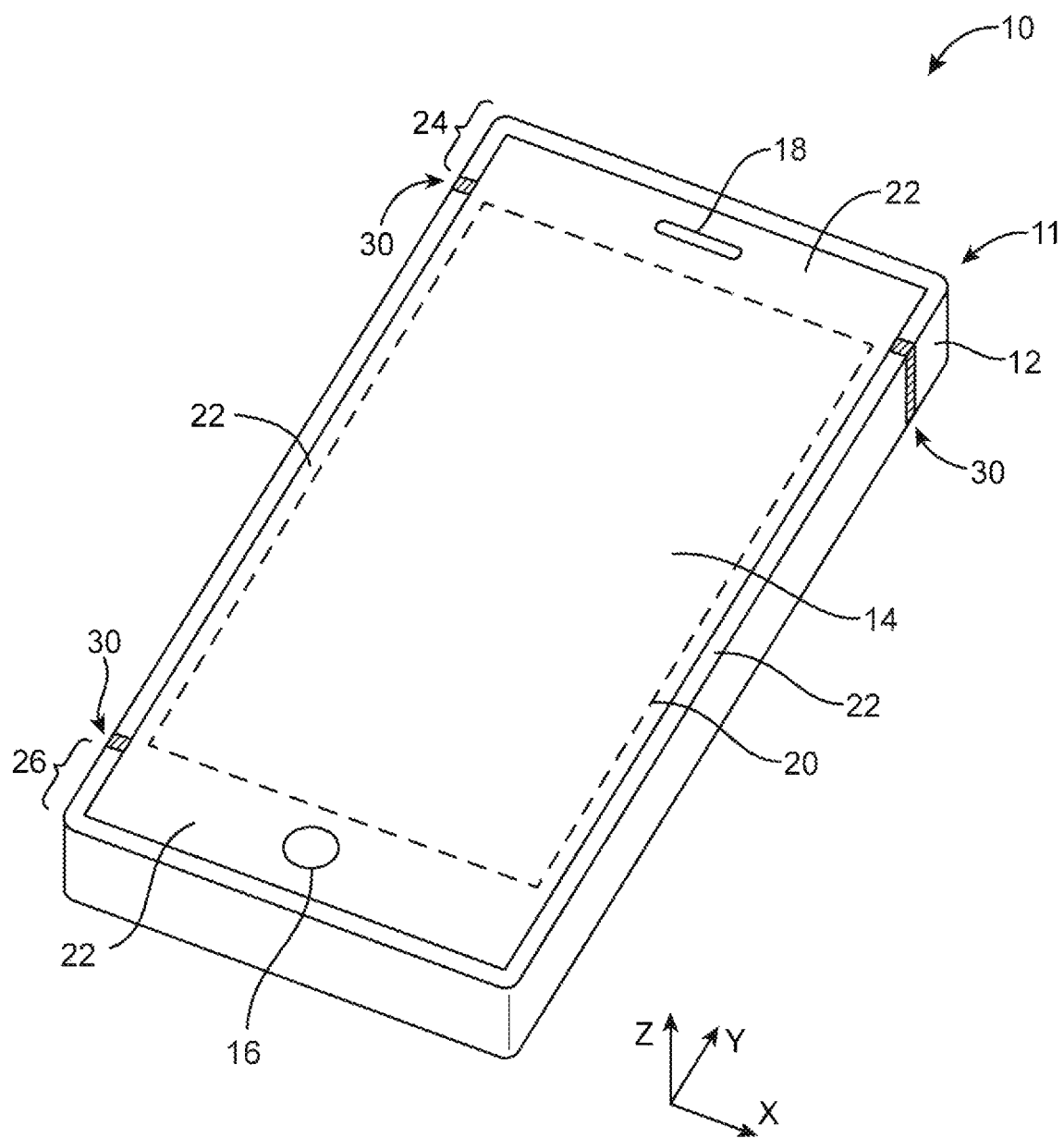
FIG. 1 is a perspective view of an illustrative electronic device of the type that may be provided with antenna structures in which an electrical connection is made to a conductive housing structure such as a conductive peripheral housing member in accordance with an embodiment of the present invention.

An illustrative electronic device that contains wireless communications circuitry is shown in FIG. 1. Device 10 of FIG. 1 may be a notebook computer, a tablet computer, a computer monitor with an integrated computer, a desktop computer, or other electronic equipment. If desired, electronic device 10 may be a portable device such as a cellular telephone, a media player, other handheld devices, a wristwatch device, a pendant device, an earpiece device, or other compact portable device.

As shown in FIG. 1, device 10 may have a housing such as housing 11. Housing 11 may be formed from materials such as plastic, metal, carbon fiber and other fiber composites, ceramic, glass, wood, other materials, or combinations of these materials. Device 10 may be formed using a unibody construction in which some or all of housing 11 is formed from a single piece of material (e.g., a single cast or machined piece of metal, a single piece of molded plastic, etc.) or may be formed from frame structures, housing sidewall structures, and other structures that are assembled together using fasteners, adhesive, and other attachment mechanisms. In the illustrative arrangement shown in FIG. 1, housing 11 includes conductive peripheral housing member 12. Conductive peripheral housing member 12 may have a ring shape that runs around the rectangular periphery of device 10. One or more gaps such as gaps 30 may be formed in conductive peripheral housing member 12. Gaps such as gaps 30 may be filled with dielectric such as plastic and may interrupt the otherwise continuous shape of conductive peripheral housing member. Conductive peripheral housing member may have any suitable number of gaps 30 (e.g., more than one, more than two, three or more, less than three, etc.).

Conductive peripheral housing member 12 may be formed from a durable material such as metal. Stainless steel may be used for forming housing member 12 because stainless steel is aesthetically appealing, strong, and can be machined during manufacturing. Other metals may be used if desired. The rear face of housing 11 may be formed from plastic, glass, metal, ceramic composites, or other suitable materials. For example, the rear face of housing 11 may be formed form a plate of glass having regions that are backed by a layer of internal metal for added strength. Conductive peripheral housing member 12 may be relatively short in vertical dimension Z (e.g., to serve as a bezel for display 14) or may be taller (e.g., to serve as the sidewalls of housing 11 as shown in the illustrative arrangement of FIG. 1).

Device 10 may include components such as buttons, input-output port connectors, ports for removable media, sensors, microphones, speakers, status indicators, and other device components. As shown in FIG. 1, for example, device 10 may include buttons such as menu button 16. Device 10 may also include a speaker port such as speaker port 18 (e.g., to serve as an ear speaker for device 10).

One or more antennas may be formed in device 10. The antennas may, for example, be formed in locations such as locations 24 and 26 to provide separation from the conductive elements of display 14. Antennas may be formed using single band and multiband antenna structures. Examples of communications bands that may be covered by the antennas include cellular telephone bands (e.g., the bands at 850 MHz, 900 MHz, 1800 MHz, 1900 MHz, and 2100 MHz), satellite navigation bands (e.g., the Global Positioning System band at 1575 MHz), wireless local area network bands such as the IEEE 802.11 (WiFi®) bands at 2.4 GHz and 5 GHz, the Bluetooth band at 2.4 GHz, etc. Examples of antenna configurations that may be used for the antennas in device 10 include monopole antennas, dipole antennas, strip antennas, patch antennas, inverted-F antennas, coil antennas, planar inverted-F antennas, open slot antennas, closed slot antennas, loop antennas, hybrid antennas that include antenna structures of multiple types, or other suitable antenna structures.

Device 10 may include one or more displays such as display 14. Display 14 may be a liquid crystal display (LCD), an organic light-emitting diode (OLED) display, a plasma display, an electronic ink display, etc. A touch sensor may be incorporated into display 14 (i.e., display 14 may be a touch screen). The touch sensor may be an acoustic touch sensor, a resistive touch sensor, a piezoelectric touch sensor, a capacitive touch sensor (e.g., a touch sensor based on an array of indium tin oxide capacitor electrodes), or a touch sensor based on other touch technologies.

Display 14 may be covered by a transparent planar conductive member such as a layer of glass or plastic. The cover layer for display 14, which is sometimes referred to as a cover glass layer or cover glass, may extend over substantially all of the front face of device 10, as shown in FIG. 1. The rectangular center portion of the cover glass (surrounded by dashed line 20 in FIG. 1) contains an array of image pixels and is sometimes referred to as the active portion of the display. The peripheral outer portion of the cover glass (i.e., rectangular peripheral ring 22 of FIG. 1) does not contain any active image pixels and is sometimes referred to as the inactive portion of display 14. A patterned opaque masking layer such as a peripheral ring of black ink may be formed under inactive portion 22 to hide interior device components from view by a user.

Figure 2:
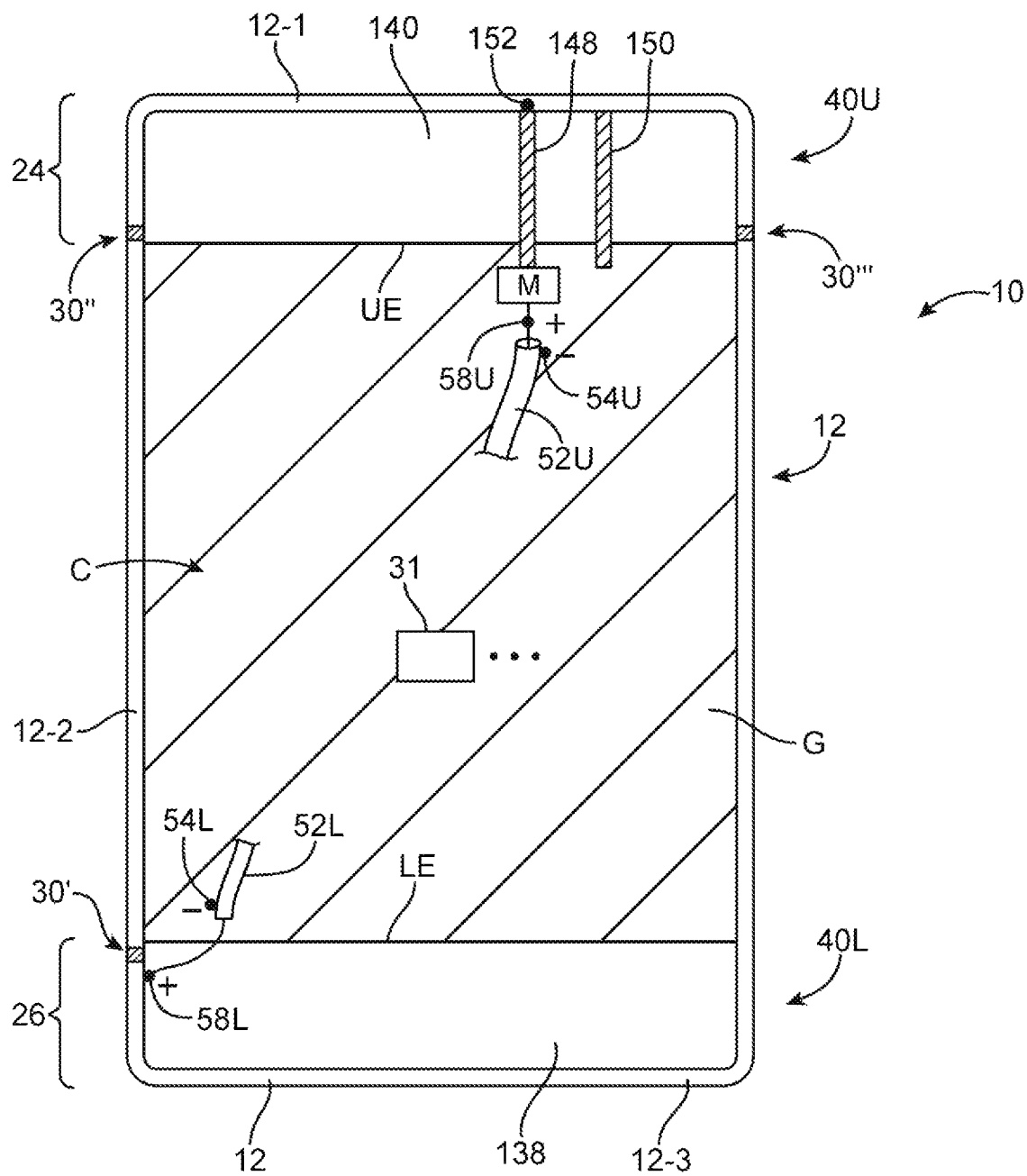
FIG. 2 is a top interior view of an electronic device of the type shown in FIG. 1 in which electrical connections are made to a conductive peripheral housing member in accordance with an embodiment of the present invention.

FIG. 2 is a top view of the interior of device 10 showing how antennas 40L and 40U may be implemented within housing 12. As shown in FIG. 2, ground plane G may be formed within housing 12. Ground plane G may form antenna ground for antennas 40L and 40U. Because ground plane G may serve as antenna ground, ground plane G may sometimes be referred to as antenna ground, ground, or a ground plane element (as examples). One or more printed circuit boards or other mounting structures may be used to mount components 31 in device 10. Components 31 may include radio-frequency transceiver circuits that are coupled to antennas 40U and 40L using transmission lines 52L and 52U, processors, application-specific integrated circuits, cameras, sensors, switches, connectors, buttons, and other electronic device components.

In central portion C of device 10, ground plane G may be formed by conductive structures such as a conductive housing midplate member (sometimes referred to as an internal housing plate or planer internal housing structures). The structures of ground plane G may be connected between the left and right edges of member 12. Printed circuit boards with conductive ground traces (e.g., one or more printed circuit boards used to mount components 31) may form part of ground plane G.

The midplate member may have one or more individual sections (e.g., patterned sheet metal sections) that are welded together. Portions of the midplate structures may be covered with insert-molded plastic (e.g., to provide structural support in portions of the interior of device where no conductive ground is desired, such dielectric-filled portions of antennas 40U and 40L in regions 24 and 26).

At ends 24 and 26 of device 10, the shape of ground plane G may be determined by the shapes and locations of conductive structures that are tied to ground. Ground plane G in the simplified layout of FIG. 2 has a straight upper edge UE and a straight lower edge LE. In actual devices, the upper and lower edges of ground plane G and the interior surface of conductive peripheral housing member 12 generally have more complex shapes determined by the shapes of individual conductive structures that are present in device 10. Examples of conductive structures that may overlap to form ground plane G and that may influence the shape of the inner surface of member 12 include housing structures (e.g., a conductive housing midplate structure, which may have protruding portions), conductive components (e.g., switches, cameras, data connectors, printed circuits such as flex circuits and rigid printed circuit boards, radio-frequency shielding cans, buttons and conductive button mounting structures), and other conductive structures in device 10. In the illustrative layout of FIG. 2, the portions of device 10 that are conductive and tied to ground to form part of ground plane G are shaded and are contiguous with central portion C.

Openings such as openings 138 and 140 (sometimes referred to as gaps) may be formed between ground plane G and respective portions of peripheral conductive housing member 12. Openings 138 and 140 may be filled with air, plastic, and other dielectrics and are therefore sometimes referred to as dielectric-filled gaps or openings. Openings 138 and 140 may be associated with antenna structures 40U and 40L.

Lower antenna 40L may be formed by a loop antenna structure having a shape that is determined at least partly by the shape of the lower portions of ground plane G and conductive housing member 12. In the example of FIG. 2, opening 138 is depicted as being rectangular, but this is merely illustrative. In practice, the shape of opening 138 may be dictated by the placement of conductive structures in region 26 such as a microphone, flex circuit traces, a data port connector, buttons, a speaker, etc.

Lower antenna 40L may be fed using an antenna feed made up of positive antenna feed terminal 58L and ground antenna feed terminal 54L. Transmission line 52L may be coupled to the antenna feed for lower antenna 40L. Gap 30' may form a capacitance that helps configure the frequency response of antenna 40L. If desired, device 10 may have conductive housing portions, matching circuit elements, and other structures and components that help match the impedance of transmission line 52L to antenna 40L.

Antenna 40U may be a two-branch inverted-F antenna. Transmission line 52U may be used to feed antenna 40U at antenna feed terminals 58U and 54U. Conductive structures 150 may form a shorting path that bridges dielectric opening 140 and electrically shorts ground plane G to peripheral housing member 12. Conductive structure 148 (which may be formed using structures of the type used in forming structures 150 or other suitable structures) and matching circuit M may be used to connect antenna feed terminal 58U to peripheral conductive member 12 at point 152. Conductive structures such as structures 148 and 150 (which are sometimes referred to as conductive paths) may be formed by flex circuit traces, conductive housing structures, springs, screws, welded connections, solder joints, brackets, metal plates, or other conductive structures.

Gaps such as gaps 30', 30", and 30''' (e.g., gaps 30 of FIG. 1) may be present in peripheral conductive member 12. A phantom gap may be provided in the lower right-hand portion of device 10 for aesthetic symmetry if desired. The presence of gaps 30', 30", and 30''' may divide peripheral conductive housing member 12 into segments. As shown in FIG. 2, peripheral conductive member 12 may include first segment 12-1, second segment 12-2, and third segment 12-3.

Segment 12-1 may form antenna resonating element arms for antenna 40U. In particular, a first portion (segment) of segment 12-1 may extend from point 152 (where segment 12-1 is fed) to the end of segment 12-1 that is defined by gap 30" and a second portion (segment) of segment 12-1 may extend from point 152 to the opposing end of segment 12-1 that is defined by gap 30'''. The first and second portions of segment 12-1 may form respective branches of an inverted F antenna and may be associated with respective low band (LB) and high band (HB) antenna resonances for antenna 40U. The relative positions of structures 148 and 150 along the length of member 12-1 may affect the response of antenna 40U and may be selected to tune antenna 40U. Antenna tuning adjustments may also be made by adjusting matching circuit M, by adjusting the configuration of components used in forming paths 148 and 150, by adjusting the shapes of opening 140, etc. Antenna 40L may likewise be adjusted.

With one illustrative arrangement, antenna 40L may cover the transmit and receive sub-bands in five communications bands (e.g., 850 MHz, 900 MHz, 1800 MHz, 1900 MHz, and 2100 MHz). Antenna 40U may, as an example, be configured to cover a subset of these five illustrative communications bands. For example, antenna 40U may be configured to cover a two receive bands of interest and, with tuning, four receive bands of interest.

Figure 3:
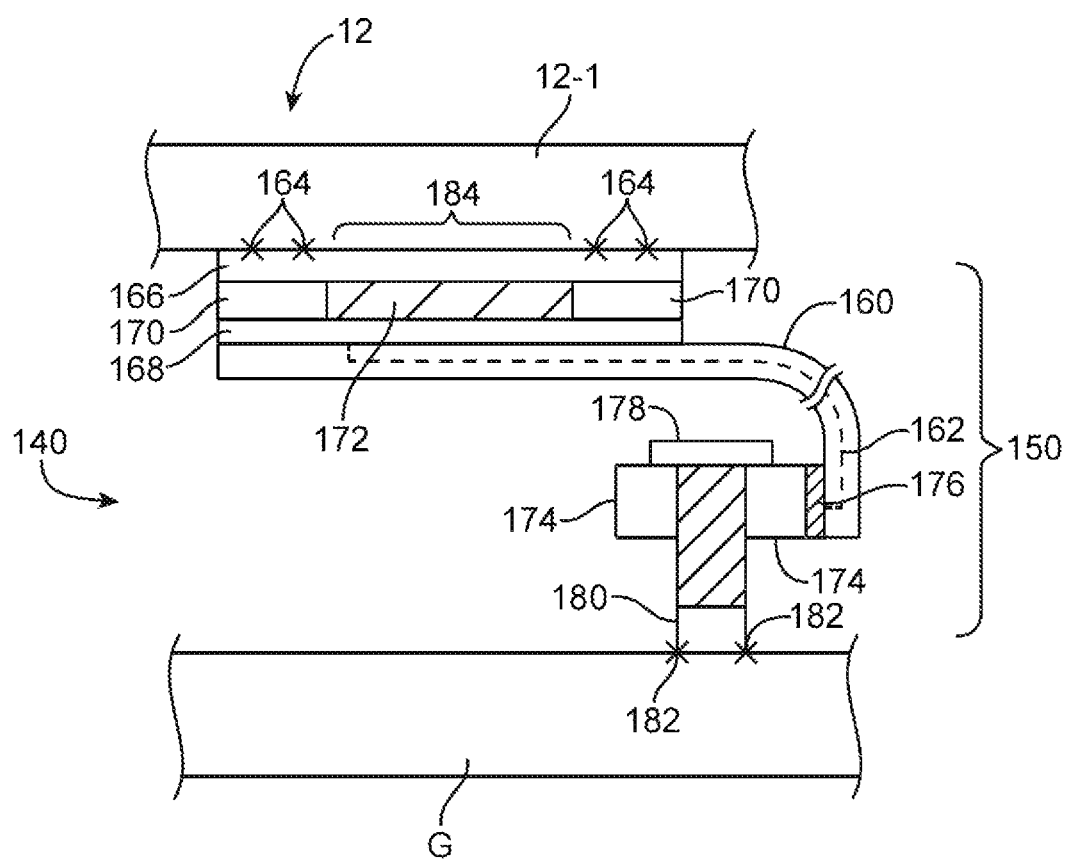
FIG. 3 is a diagram showing illustrative structures that may be used in forming an electrical connection between an internal housing structure such as a ground plate member and a conductive peripheral housing member in accordance with an embodiment of the present invention.

Illustrative structures that may be used to form shorting path 150 of FIG. 2 (e.g., the electrical path in antenna 40U that spans peripherally enclosed dielectric opening 140 and to short conductive peripheral housing member 12 to ground plane G) are shown schematically in FIG. 3. As shown in FIG. 3, path 150 may include one or more components such as flex circuit 160 that can be adjusted as part of the manufacturing process used to form device 10. Flex circuits, which are also sometimes referred to as flexible printed circuits, contain layers of flexible dielectric (typically polyimide or other flexible polymer sheets) and conductive traces (e.g. metal traces such as copper traces or copper traces coated with gold). The layout of the trace pattern on a flex circuit can be adjusted separately from the layout of the remaining structures in device 10 (e.g., the size and shape of structural members such as midplate structures G and conductive peripheral housing member 12). Tuning components such as resistors, capacitors, and inductors can also be added to a flex circuit. Adjustments to antenna 40U may generally be made more readily by changing the tuning components and trace layout for a structure such as flex circuit 160 than by changing the machining of member 12 or other housing structures.

As shown in FIG. 3, flex circuit 160 includes one or more traces such as trace 162. Changes that may be made to path 150 to adjust antenna 40U include changes to the length of trace 162, changes to the width of trace 162, changes to the shape of trace 162, the addition or removal of matching circuit components on flex circuit 162 such as the addition or removal of capacitors, resistors, inductors, and other changes to the properties of flex circuit 160 and other structures shown in FIG. 3.

In the illustrative arrangement of FIG. 3, flex circuit 160 has been connected to conductive peripheral housing member 12 (e.g., housing member segment 12-1) using a combination of solder and welds. Welds 164 have been used to connect metal member 166 to conductive peripheral housing member 12. Metal member 166 may be a metal plate having one or more openings (not shown in FIG. 3) that permit solder 172 to penetrate and help hold member 166 in place. Solder 172 may form a connection between metal member 166 and traces on flex circuit 160 such as solder pad 168.

Flex circuit dielectric layer portions such as dielectric structures 170 may help prevent solder 172 from flowing under metal member 166 in the vicinity of welds 164. The process of forming welds 164 tends to disrupt the surface of member 166 in the vicinity of welds 164 (e.g., by disrupting or even removing some of the surface coating layer of member 166 in configurations where a solder-compatible coating is formed on member 166). This disrupted surface on member 166 is not as suitable as other portions of member 166 (e.g., the portions of member 166 in region 184) for forming consistent solder joints with solder 172. It may therefore be desirable to interpose dielectric structures such as structures 170 between flex circuit 160 and member 166 in the regions of member 166 that have been exposed to welding (i.e., the portions of member 166 in the vicinity of welds 164 in the FIG. 3 example). Because structures 170 cover the edges of solder pad 168 (in the illustrative arrangement of FIG. 3), these portions of solder pad 168 will repel solder 172. Solder 172 will therefore be confined to the portions of member 166 away from welds 164.

To ensure satisfactory formation of welds 164 between member 166 and housing member 12 while simultaneously forming a satisfactory solder joint between member 166 and solder pad 168 on flex circuit 160, it may be desirable to form member 166 from a material such as nickel (or other materials such a tin, gold, etc.). As an example, member 166 may be formed from a stainless steel plate that has been plated with nickel or other solder-compatible coating. The nickel coating or other solder-compatible coating on member 166 may help solder 172 adhere to member 166 while forming a good electrical connection between solder 172 and member 166. Solder pad 168 may be formed from gold plated copper or other conductor that forms a satisfactory bond with solder 172.

Traces 162 in flex circuit 160 may be soldered to bracket 174 using solder 176. If desired, bracket 174 may be soldered to flex circuit 160 before flex circuit 160 is installed in device 10 to form path 150. Metal screw 178 may be used to form an electrical and mechanical connection to metal screw boss 180. Screw boss 180 may be welded to ground plane G (e.g., a metal midplate member or other internal housing structures) using welds 182. The metal midplate member or other structures of ground plane G may be formed from stainless steel (e.g., sheet metal) structures that have been machined to form mounting features for receiving internal device components.

Figure 4:
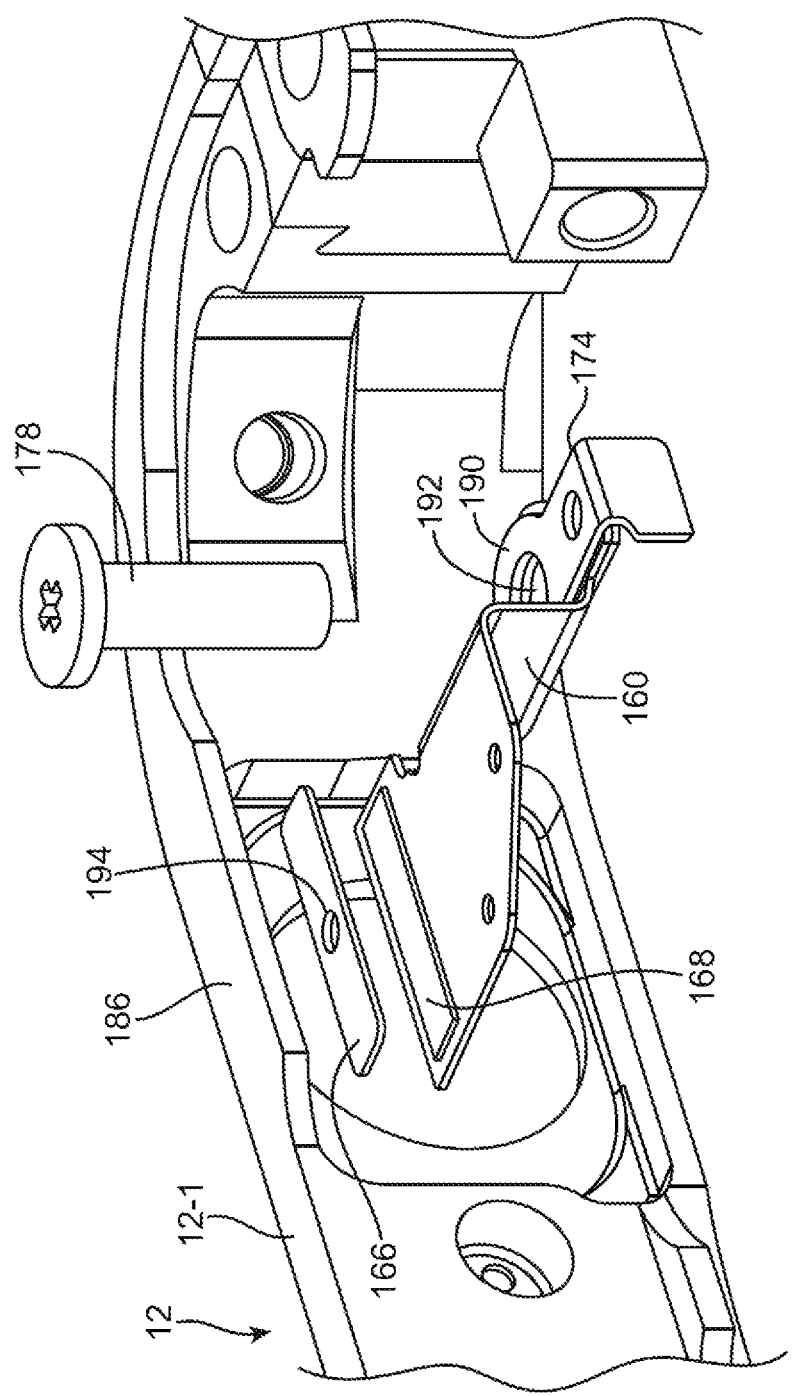
FIG. 4 is a perspective view of an interior portion of an electronic device of the type shown in FIGS. 1 and 2 showing how a flex circuit and associated structures may be used in forming an electrical connection to a conductive peripheral housing member in accordance with an embodiment of the present invention.

FIG. 4 is an exploded perspective view of illustrative structures that may be used in forming conductive path 150. As shown in FIG. 4, conductive peripheral housing member may have a feature such as lip 186 or other protruding structure to which member 166 may be attached (e.g., using welds 164 of FIG. 3 to attach member 166 to the underside of lip 186). Solder may flow into hole 194 to help hold the structures of path 150 together following soldering.

Bracket 174 may have prongs 190 surrounding opening 192. Opening 192 may receive screw 178 when screw 178 is screwed into screw boss 180 (FIG. 3). When assembled, current can flow from the internal traces of flex circuit 160 into bracket 174, screw 178, screw boss 180, and into ground G (to which boss 180 is connected).

Figure 5:
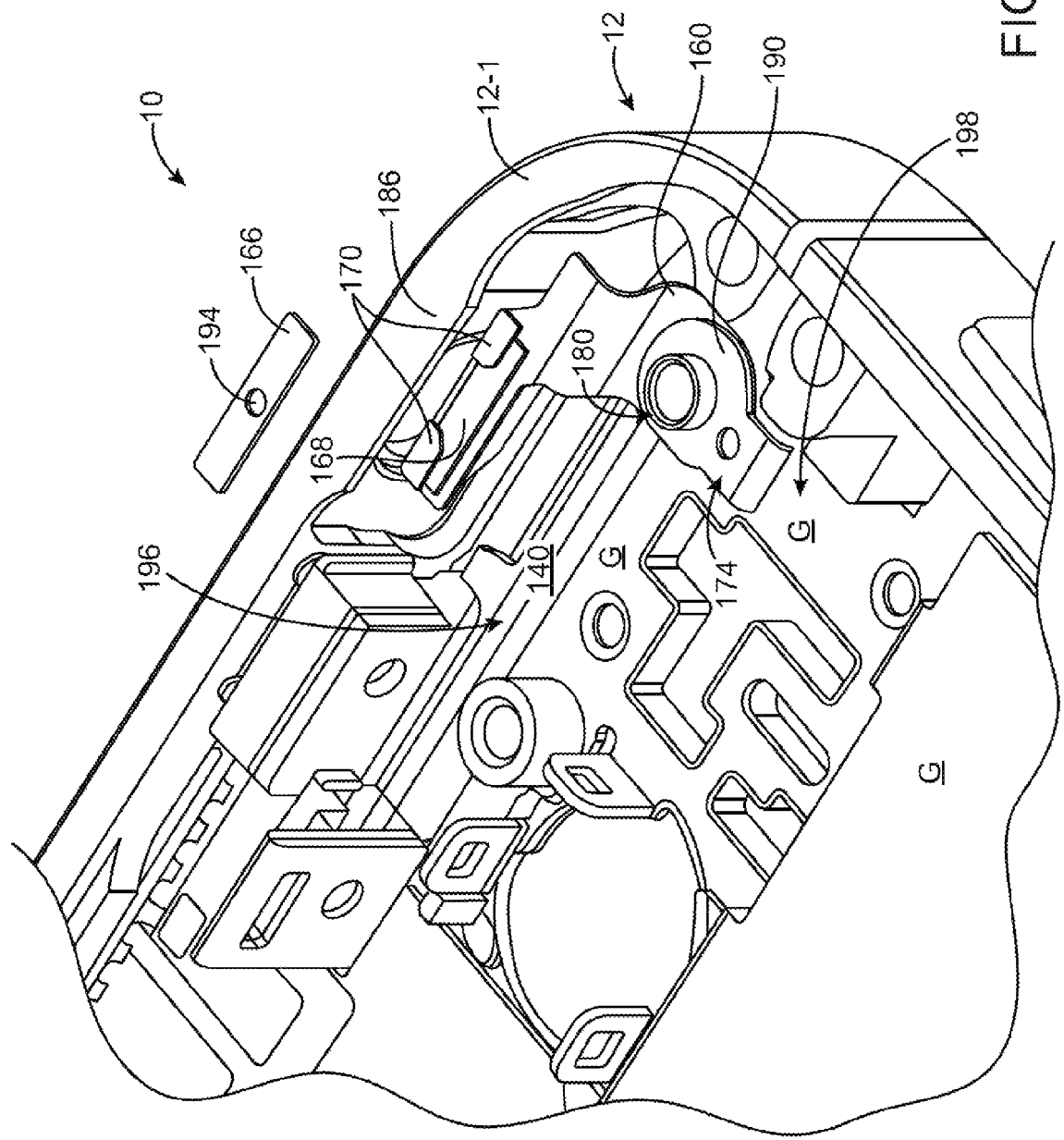
FIG. 5 is an exploded perspective view of an electronic device having a flex circuit connection arrangement of the type shown in FIG. 4 in accordance with an embodiment of the present invention.

FIG. 5 is an exploded perspective view of device 10 in the vicinity of path 150. Ground plane G (e.g., the midplate housing structure for device 10) may include regions such as plastic-coated sheet metal region 198. Plastic extension plate 196 extends into region 140 along the upper edge of ground G. Because extension plate 196 is formed from dielectric, plate 196 forms part of dielectric opening 140.

Shielding layer portions 170 (e.g., a layer of patterned polyimide associated with flex circuit 160) may cover only part of each end of solder pad 168 (i.e., the portion under welds 164 between member 166 and lip 186 of peripheral conductive housing member 12), so that the exposed portion of solder pad 168 that is visible in FIG. 5 forms a "T" shape. Other patterns of polyimide or other materials may be used to prevent solder on pad 168 from contacting the underside of member 166 in the vicinity of welds 164 if desired.

Figure 6:
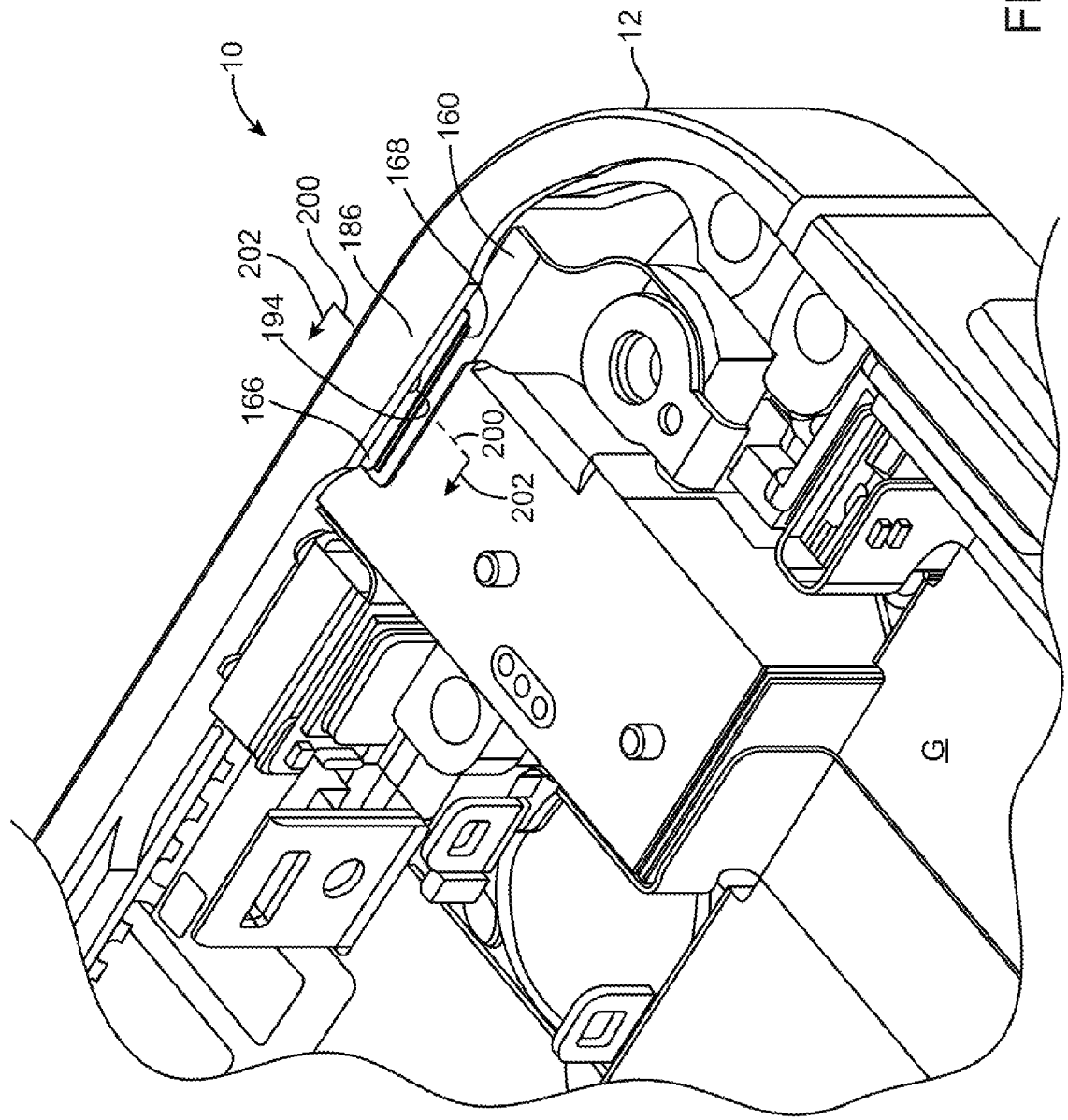
FIG. 6 is a perspective view of the flex circuit connection structures of FIG. 5 in accordance with an embodiment of the present invention.

FIG. 6 is perspective view of the interior portions of device 10 of FIG. 5. As shown in FIG. 6, when member 166 is attached to the lower portion of lip 168 of peripheral conductive housing member 12, a portion of member 166 may protrude sufficiently to expose a portion of opening 194. Pad 168 may also protrude somewhat from under member 166.

Figure 7:
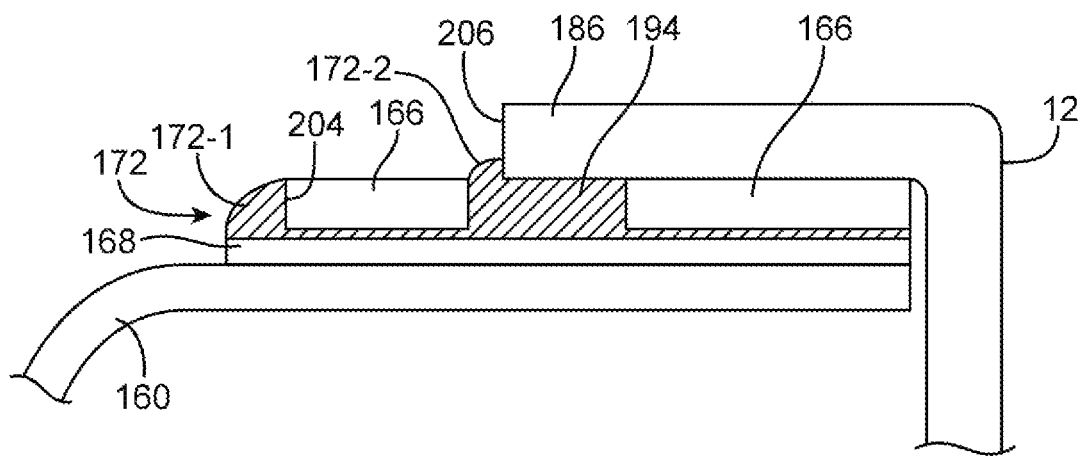
FIG. 7 is a cross-sectional side view of a flex circuit attached to a conductive peripheral housing member in accordance with an embodiment of the present invention.

A cross-sectional side view of member 166 on peripheral conductive housing member 12 taken along line 200 of FIG. 6 and viewed in direction 202 is shown in FIG. 7. As shown in FIG. 7, the protrusion of solder pad 168 from under the edge of member 166 allows solder portion 172-1 to extend up front face 204 of member 166. Hole 194 allows solder 172-2 to extend up front face 206 of lip portion 186 of peripheral conductive housing member. Distributing solder 172 in this way may help hold the structures of FIG. 7 in place.

Figure 8:
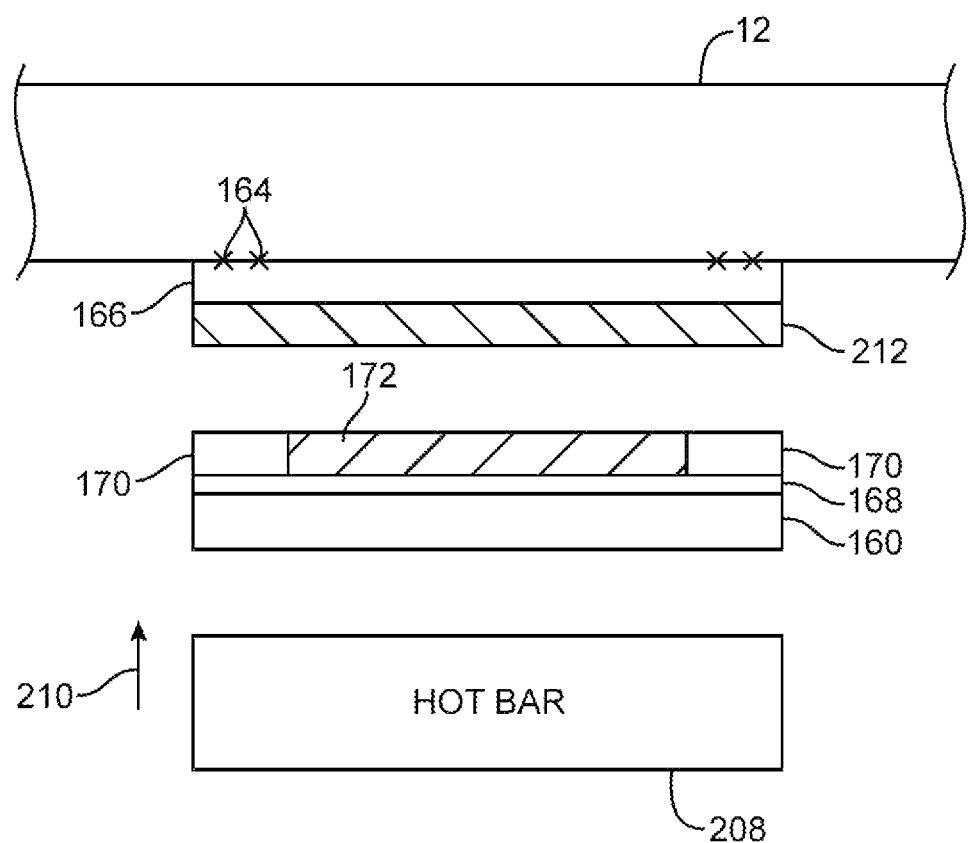
FIG. 8 is a side view of flex circuit structures and a portion of a conductive peripheral housing member during assembly using a hot bar tool in accordance with an embodiment of the present invention.

Soldering operations may be performed using a hot-bar technique of the type illustrated in FIG. 8. As shown in FIG. 8, the underside of member 166 may be coated with solder flux 212 following welding of member 166 to peripheral conductive housing member 12 with welds 164. Hot-bar soldering head 208 may be moved upwards in direction 210. This compresses flex circuit 160 against member 166 and peripheral conductive housing member 12. Solder 172 is melted by the heat from hot bar 208, thereby forming a solder joint between the traces of flex circuit 160 and member 166. Member 166 is preferably formed from a material that accepts solder joints (e.g., nickel-plated stainless steel). If desired, a portion of peripheral conductive member 12 may be machined to form structure 166 and plated with nickel or other suitable substances for facilitating solder joint formation. The use of a separate member such as member 166 that is welded to peripheral conductive housing member 12 is merely illustrative.

Figure 9:
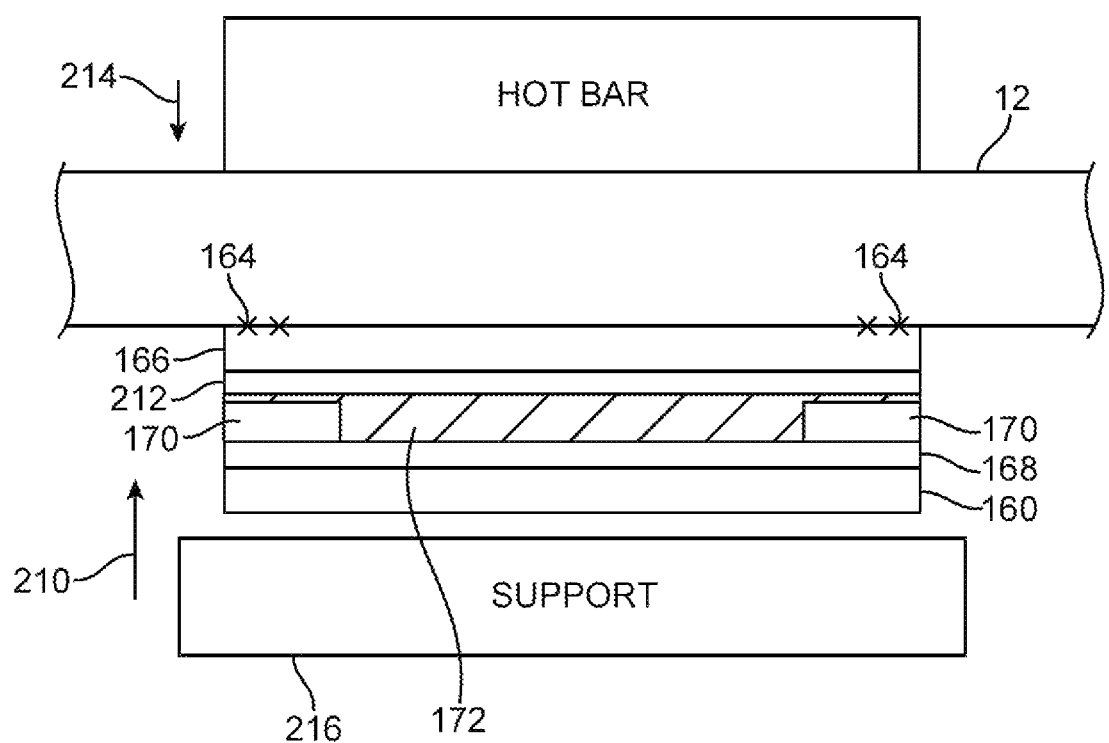
FIG. 9 is a side view of flex circuit structures and a portion of a conductive peripheral housing member during assembly using a hot bar tool and a support structure in accordance with an embodiment of the present invention.

Another illustrative hot-bar soldering arrangement that may be used in attaching flex circuit 160 to peripheral conductive housing member 12 is shown in FIG. 9. With an arrangement of the type shown in FIG. 9, hot-bar soldering head 208 may bear against peripheral conductive housing member 12 in direction 214, rather than direction 210. To ensure that the structures of FIG. 9 are compressed together during soldering, support 216 may be press against flex circuit 160 in opposing direction 210.

The use of hot bar soldering to form the connection between flex circuit 160 and member 166 and thereby peripheral conductive housing member 12 is merely illustrative. Other types of connections may be formed if desired.

For example, laser soldering techniques may be used to supply the heat necessary to melt solder 172 instead of using hot bar 208.

As another example, a piece of self-igniting material (e.g., Nanofoil®) may be placed in the solder joint in place of solder flux 212. An exposed tail portion of the self-igniting material may be exposed to laser light to initiate ignition. The self-igniting material may then consume itself and generate sufficient heat to form the solder joint.

If desired, member 166 may be soldered to flex circuit 160 before attachment to peripheral conductive housing member 12. Following attachment of member 166 and flex 160, the assembly formed by member 166 and flex 160 may be welded to peripheral conductive housing member 12.

Materials such as conductive epoxy or other conductive adhesives may also be used in attaching flex circuit 160. With this type of arrangement, solder 172 may be replaced with conductive adhesive.

The use of conductive adhesive or solder can be reduced or eliminated by treating the surfaces of the components that are being connected. For example, a diamond-impregnated gold plating layer may be formed on pad 168. Flex circuit 160 may then be compressed against peripheral conductive housing member 12 using a bracket with a rubber shim. When compressed in this way, the sharp diamond particles or other particles in the surface of flex circuit 160 may penetrate into peripheral conductive housing member 12 to form a satisfactory electrical contact.

If desired, member 166 may be plated differently on each of its sides. For example, one side of member 166 may be plated with nickel (e.g., to receive solder 172) and the other side of member 166 may be plated with a substance that is optimized for forming welds 164 or may be left unplated. As another example, a tin-based plating may be formed adjacent to solder 172 and flex circuit 160 and a nickel plating layer may be formed on the side of member 166 adjacent to welds 164. Gold plating may be formed on the solder side and the other side left unplated, etc. Using a plating configuration in which one side is optimized for forming solder joints (e.g., using tin plating or nickel plating) while the other side is optimized for forming welds (e.g., by being left unplated rather than including a coating such as tin that might impede welds) may help member 166 form a connection both to structures such as member 12 that benefit from the use of welds and structures such as pad 168 and flex circuit 160 that benefit from the use of solder.

According to another aspect, techniques for reducing or eliminating dendrite formations are provided. Dendrite formation can occur through electrochemical migration processes. The growth mechanism for dendrites is understood to require some type of moisture capable of dissolving metal into a solution of metal ions which are then redistributed by electromigration in the presence of an electromagnetic field. As portable electronic devices continue to become more compact, dendrite formation becomes more likely and can lead to undesired electrical problems, such as electrical short circuits or other electrical disturbances.

When two conductive members having a potential difference are not in contact but are positioned closed to one another, such as being separated by on the order of 0.1 mm or less, dendrite formation can undesirably occur. Embodiment are disclosed herein to reducing or eliminating dendrite formation within compact portable electronic devices that may place conductive members with different potentials very close to one another (e.g., less than about 1 mm separation). During manufacturer or assembly, these different potentials can end up being very close such as on the order of 0.1 mm or less which could lead to dendrite formation.

In one embodiment, a non-conductive barrier can be interposed between two conductive members with different potentials. Here, the non-conductive barrier, provides not only a physical barrier to dendrite formation but also serves to maintain a physical separation of the two conductive members so that two conductive member are ensured to remain separated by more than 0.1 mm so that dendrite formations are not formed.

Figure 10A:
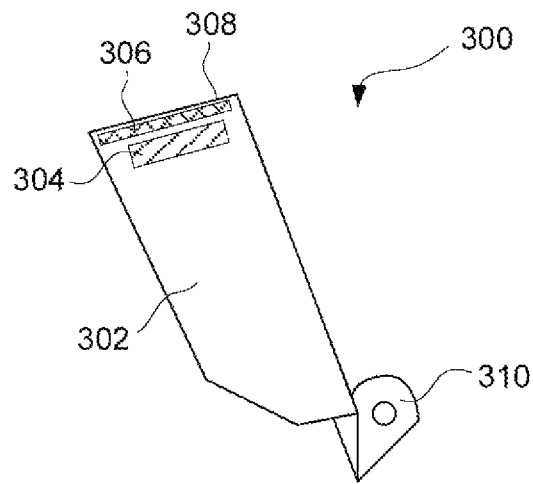
FIG. 10A illustrates a perspective view of a conductive coupling member according to one embodiment.

FIG. 10A illustrates a perspective view of a conductive coupling member 300 according to one embodiment. The conductive coupling member 300 can, for example, serve to electronically couple peripheral conductive member of a housing member to an internal ground internal to the housing.

The conductive coupling member 300 can, for example, include a flex circuit 302. For example, in one implementation, the flex circuit 302 is suitable for use as the flex circuit 160 illustrated in FIGS. 3-6 according to one implementation. However, the flex circuit 302 further provides for anti-dendrite formation. Namely, the flex circuit 302 can includes not only a solder pad 304 but also a solder flow barrier 306. The solder pad 304 can pertain to the solder pad 168 discussed above. The solder flow barrier 306 can provide a barrier at an edge 308 of the flex circuit 302. As a result, the solder of the solder pad 304 on reflow does not encroach upon the edge 308 of the flex circuit 302. As a result, the placement of the solder after reflow is ensured to be constrained inward from the edge 308. The solder flow barrier 306 can, for example, be formed of solder mask or, more particularly, solder mask glue. The For example, as shown in FIG. 4, the flex circuit 302 can be positioned closely adjacent to an electrical connector opening. The electrical connector opening can include a metal member that has a positive potential (e.g., 5 Volts). When the flex circuit 302 is assembled, the solder within the solder pad 304 is reflowed when soldering the flex circuit 302 to the peripheral conductive member of a housing member. As an example, as discussed above, the flex circuit 160 can be solder to the member 166 which has been welded to the peripheral conductive housing member 12. When the flex circuit 302 is used instead of the flex circuit 160, the solder flow barrier 306 is able to deter solder within the solder pad 304 from flowing to the edge 308 of the flex circuit 302 that is adjacent another conductive potential, such as an electrical connector jack (or port).

Although FIG. 10A illustrated the solder flow barrier 306 being formed adjacent the edge 308 of the flex circuit 302, the flex circuit 302 has various other edges that can be partially or completely protected from solder reflow.

Figure 10B:
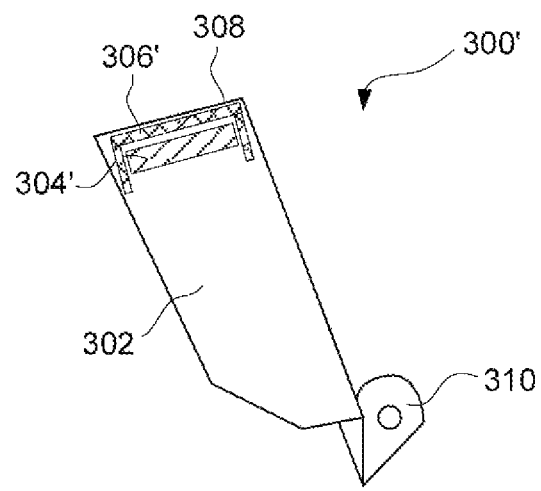
FIG. 10B illustrates a perspective view of a conductive coupling member according to another embodiment.

FIG. 10B illustrates a perspective view of a conductive coupling member 300' according to another embodiment. The conductive coupling member 300' is similar to the conductive coupling member 300 illustrated in FIG. 10B except that a solder pad 306' is slightly larger than the solder pad 306, and a solder reflow barrier 308' products from solder reflow not only the edge 308 but also portion of other sides of the flex circuit 302 that are near the solder pad 306'.

Figure 11A:
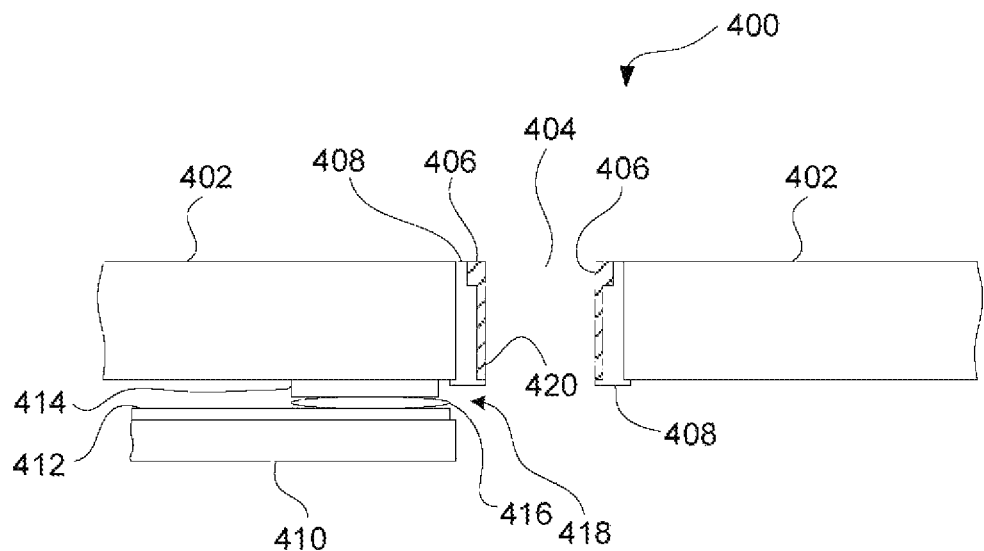
FIG. 11A illustrates a partial cross-sectional view of a housing for an electronic device, such as a portable electronic device, according to one embodiment.

FIG. 11A illustrates a partial cross-sectional view of a housing 400 for an electronic device, such as a portable electronic device, according to one embodiment. The housing 400 includes a peripheral conductive member 402. The peripheral conductive member 402 can include an opening that supports a connector port 404 inserted therein. The connector port 404 includes an inner metal portion 406 and an outer plastic portion 408. An audio connector can be inserted into the connector port 404 to electrically connect with the inner metal portion 406. Additionally, in an internal portion of the housing 400, there is a flex circuit 410. The flex circuit 410 can be used to provide a ground connection between the peripheral conductive member 402 and an internal ground plane. In this regard, the flex circuit 410 can include a solder trace 412 that will serve as the electrical conductor that connects to the internal ground plane. A metal member 414 can be connected to the peripheral conductive member 402. For example, the metal member 414 can be soldered or welded to the inner surface of the peripheral conductive member 402. Additionally, the flex circuit 410 can then be attached to the metal member 414 which a conductive attachment material 416. For example, the conductive attachment material 416 can be solder and thus the flex circuit 410 can be soldered to the metal member 414. As discussed above, the solder can be reflowed using a hot bar solder technique to thereby electrically connect the peripheral conductive member 402 to the flex circuit 410.

Due to the compact nature of the electronic device, the conductive attachment material 416, namely, solder on being reflowed can extend into a space 418 separating the conductive attachment material 416 and the inner metal portion 406. As a result, given the close proximity of the solder (and the solder trace 412) on the flex circuit 410 to a lower portion 420 of the inner metal portion 406, the flex circuit 410 and the space 418 can become less than 0.1 mm which can lead to a risk of dendrite formation. The space 418 can be managed to maintain a minimum separation at the space 418 of more than 0.1 mm. One technique to manage the minimum separation is by a solder reflow barrier, such as the solder reflow barrier 306 or 306' discussed above with reference to FIGS. 10A and 10B. Another technique to technique to manage the minimum separation by reducing the depth of the inner metal member 406'.

Figure 11B:
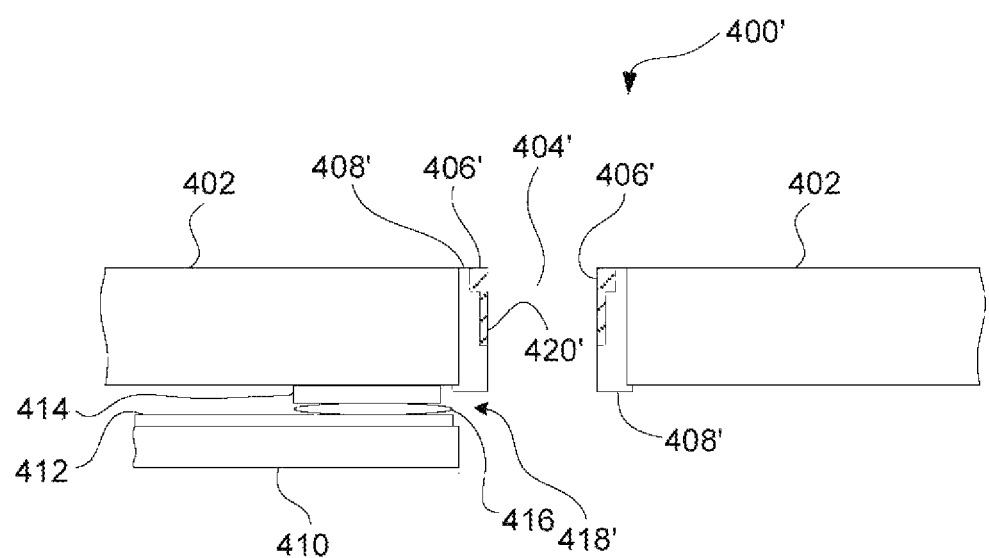
FIG. 11B illustrates a partial cross-sectional view of a housing for an electronic device, such as a portable electronic device, according to another embodiment.

FIG. 11B illustrates a partial cross-sectional view of a housing 400' for an electronic device, such as a portable electronic device, according to another embodiment. The housing 400' is generally similar to the housing 400 as shown in FIG. 11A, except for a connector port 404' which is configured differently than the connector port 404. The connector port 404' includes an inner metal portion 406' and an outer plastic portion 408'. The inner metal portion 406' is shortened such that a lower portion 420' if the inner metal portion 406' is further separate from the solder (and the solder trace 412) on the flex circuit 410 so that a space 418' does not become less than 0.1 mm which could lead to a risk of dendrite formation. In one embodiment, non-conductive material, such as plastic, can replace the portion of the inner metal portion 406' being removed by shortening of the inner metal portion 406. For example, the outer plastic portion 408' can fill in the portion of the inner metal portion 406' being removed by shortening of the inner metal portion 406.

According to another aspect, techniques for testing for dendrite formation are provided. In one embodiment, the techniques can include a method for inducing accelerated dendrite formation.

Figure 12:
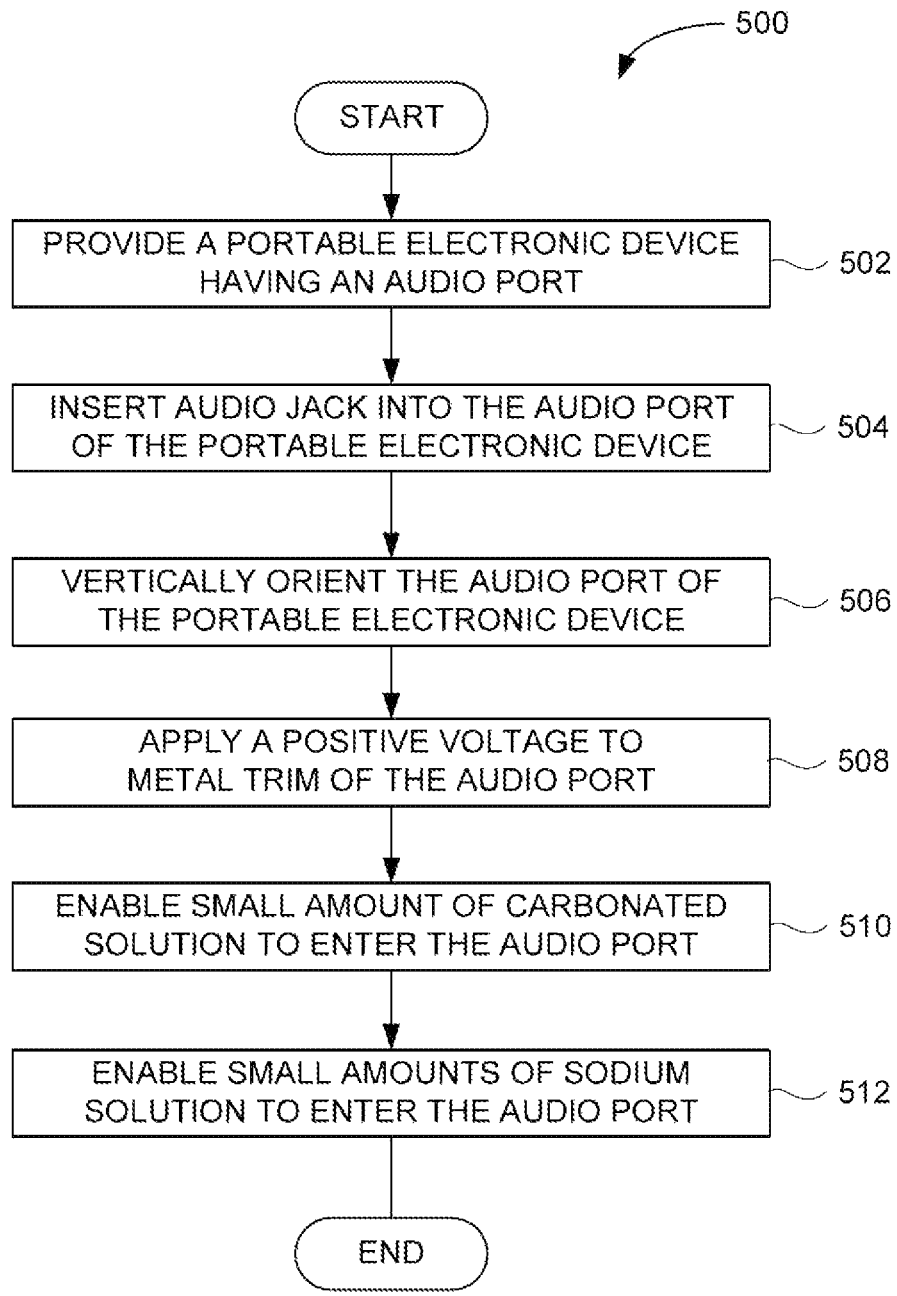
FIG. 12 is a flow diagram of an accelerated dendrite formation method according to one embodiment.

FIG. 12 is a flow diagram of an accelerated dendrite formation method 500 according to one embodiment. The method 500 can provide a portable electronic device having an audio port. The audio is, for example, an electronic port that is configured to receive an electrical connector, such as an audio jack for a headset, etc. The audio jack can be inserted 504 into the audio port of the portable electronic device. The audio port, having the audio jack inserted therein, can then be vertically oriented. In other words, the portable electronic device is position so that the audio port faces upwards. Additionally, a positive potential (e.g., 5 Volts) is applied to a conductive portion of the audio port. For example, the positive potential can be applied to the metal trim of the audio port. Thereafter, the method 500 can operate to enable 510 a small amount of a carbonated solution to enter the audio port. The carbonated solution is, for example, a carbonated beverage containing caramel color, caffeine and a sweetener. As an example, the carbonated beverage is cola. In addition, the method 500 can also enable 512 a small amount of sodium solution to enter the audio port. The sodium includes water and sodium but can include other minerals. The method 500 can then end. However, through such method 500, dendrite formations can be formed in an accelerated manner. Consequently, electronic devices can be tested for susceptibility to dendrite formations is substantially less time that conventionally possible.

The foregoing is merely illustrative of the principles of this invention and various modifications can be made by those skilled in the art without departing from the scope and spirit of the invention.

What is claimed is:

1. An electronic device, comprising:
    a housing having conductive structures that form an antenna ground for an antenna and having a peripheral conductive member that runs around at least some edges of the housing and forms at least part of the antenna, wherein the antenna ground and the peripheral conductive member are separated by a gap; and
    a conductive path that bridges the gap, wherein the conductive path includes a flex circuit that is attached to the peripheral conductive member, and wherein the flex circuit includes a solder pad of solder and a solder flow barrier, the solder flow barrier serving to block the flow of the solder at at least one side of the flex circuit.

2. The electronic device as recited in claim 1 further comprising a metal structure that forms part of the conductive path.

3. The electronic device as recited in claim 2 wherein the metal structure comprises a first metal coated with a second metal.

4. The electronic device as recited in claim 2 wherein the metal structure comprises a metal plate.

5. The electronic device as recited in claim 4 further comprising welds with which the metal plate is welded to the peripheral conductive member.

6. The electronic device as recited in claim 4 wherein the metal plate is connected to a conductive trace of the flex circuit via the solder, wherein the trace forms part of the conductive path.

7. The electronic device as recited in claim 6 wherein the peripheral conductive member comprises stainless steel and wherein the metal plate comprises a first metal that is at least partly coated with a plating layer of a second metal.

8. The electronic device as recited in claim 6 wherein the metal plate has opposing first and second surfaces, wherein the first surface is attached to the peripheral conductive member and wherein the second surface has a solder-compatible coating to which the solder is connected.

9. The electronic device as recited in claim 6 further comprising a screw and a bracket configured to attach the conductive trace in the flex circuit to the antenna ground.

10. An electronic device, comprising:
    a housing having a peripheral conductive member; and
    a flexible polymer substrate that contains a solder flow barrier and at least one conductive trace, the at least one conductive trace providing at least a portion of an electrical connection between the peripheral conductive member and an internal ground connection within the housing.

11. The electronic device as recited in claim 10, wherein the flexible polymer substrate further includes a solder pad of solder, and wherein the solder flow barrier serves to block the flow of the solder at at least one side of the flex circuit.

12. The electronic device as recited in claim 11 wherein the electronic device further comprises a metal member welded to the peripheral conductive member with welds, and wherein the metal member is connected to the conductive trace.

13. The electronic device as recited in claim 12 wherein the solder pad and wherein the solder pad is soldered to the metal member with solder.

14. The electronic device as recited in claim 10 wherein the peripheral conductive member comprises a peripheral metal housing member having a rectangular ring shape.

15. The electronic device as recited in claim 14 further comprising:
   ground plane structures, wherein the ground plane structures and at least part of the peripheral metal housing member form at least one antenna in the electronic device; and
   a metal bracket interposed in an electrical path between the conductive trace and the ground plane structures.

16. A portable electronic device, comprising:
   a housing having at least one internal conductive structure that forms an antenna ground for an antenna and having a peripheral conductive member that runs around at least some edges of the housing and forms at least part of the antenna; and
   a conductive path that includes a flex circuit that is attached between the peripheral conductive member and the at least one internal conductive member,
   wherein the flex circuit includes a solder pad of solder and a solder flow barrier, the solder being used to attach the flex circuit directly or indirectly to the peripheral conductive member, and
   wherein the solder flow barrier is configured to block the flow of the solder at at least one side of the flex circuit.

* * * * *